(12) United States Patent
Savelli et al.

(10) Patent No.: US 10,350,461 B2
(45) Date of Patent: *Jul. 16, 2019

(54) DEVICE WITH DEFORMABLE SHELL INCLUDING AN INTERNAL PIEZOELECTRIC CIRCUIT

(71) Applicant: Commissariat A L'Energie Atomique Et Aux Energies Alternatives, Paris (FR)

(72) Inventors: Guillaume Savelli, Grenoble (FR); Philippe Coronel, Barraux (FR); Thomas Huguet, Saint Martin D'heres (FR)

(73) Assignee: Commissariat A L'Energie Atomique Et Aux Energies Alternative, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/176,387

(22) Filed: Jun. 8, 2016

(65) Prior Publication Data

US 2017/0239530 A1 Aug. 24, 2017

Related U.S. Application Data

(63) Continuation of application No. PCT/FR2014/053307, filed on Dec. 12, 2014.

(30) Foreign Application Priority Data

Jan. 15, 2014 (FR) ...................................... 14 50299

(51) Int. Cl.
*A63B 43/00* (2006.01)
*A63B 39/00* (2006.01)
(Continued)

(52) U.S. Cl.
CPC ............ *A63B 43/004* (2013.01); *A63B 39/00* (2013.01); *H01L 41/1134* (2013.01);
(Continued)

(58) Field of Classification Search
CPC ... A63B 43/004; A63B 39/00; A63B 2220/53; A63B 2209/00; A63B 43/06; A63B 43/00; H01L 41/1138; H02N 2/181
See application file for complete search history.

(56) References Cited

U.S. PATENT DOCUMENTS 3,520,641 A * 7/1970 Casey .................. F04B 17/003
123/498
4,420,826 A * 12/1983 Marshall, Jr. ......... B06B 1/0611
310/337

(Continued)

FOREIGN PATENT DOCUMENTS

DE 10 2007 013 025 A1 7/2008
JP 11-267248 A1 10/1999
(Continued)

OTHER PUBLICATIONS

International Search Report and Written Opinion (Application No. PCT/FR2014/053307) dated Apr. 7, 2015.

*Primary Examiner* — Steven B Wong
(74) *Attorney, Agent, or Firm* — Burr & Brown, PLLC

(57) ABSTRACT

A device including a deformable shell delimiting an inner space, and a resilient band suspended in the inner space and including two ends secured to the deformable shell. The band includes a piezoelectric material to generate an electric voltage under the effect of the deformation of the shell and two electrodes for collecting the voltage. An electronic circuit for processing the voltage is arranged on the resilient band and connected to the electrodes of the resilient band.

13 Claims, 3 Drawing Sheets

(51) Int. Cl.
*H02N 2/18* (2006.01)
*H01L 41/113* (2006.01)
*A63B 24/00* (2006.01)
*A63B 102/02* (2015.01)

(52) U.S. Cl.
CPC .......... *H01L 41/1138* (2013.01); *H02N 2/18* (2013.01); *H02N 2/181* (2013.01); *A63B 2024/0043* (2013.01); *A63B 2039/006* (2013.01); *A63B 2102/02* (2015.10); *A63B 2209/00* (2013.01); *A63B 2220/13* (2013.01); *A63B 2220/30* (2013.01); *A63B 2220/40* (2013.01); *A63B 2220/53* (2013.01); *A63B 2220/58* (2013.01); *A63B 2220/833* (2013.01); *A63B 2225/50* (2013.01); *A63B 2225/54* (2013.01)

(56) References Cited

U.S. PATENT DOCUMENTS

| | | | | |
|---|---|---|---|---|
| 4,595,200 | A * | 6/1986 | Shishido | A63B 43/00 473/570 |
| 4,754,441 | A * | 6/1988 | Butler | G10K 9/121 310/26 |
| 4,864,548 | A * | 9/1989 | Butler | B06B 1/085 310/26 |
| 5,447,314 | A * | 9/1995 | Yamazaki | A63B 24/0021 473/353 |
| 5,497,357 | A * | 3/1996 | Dahlstrom | G10K 9/121 310/337 |
| 5,734,107 | A * | 3/1998 | Boehm | G01P 15/0922 29/25.35 |
| 6,572,492 | B2 * | 6/2003 | Tinsman | A63B 24/0021 473/351 |
| 7,654,922 | B2 * | 2/2010 | Vassilev | A63B 41/12 473/570 |
| 9,636,550 | B2 * | 5/2017 | Thurman | A63B 43/004 |
| 2011/0077112 | A1 * | 3/2011 | Erario | A63B 41/02 473/570 |
| 2011/0118062 | A1 * | 5/2011 | Krysiak | A63B 41/02 473/570 |
| 2011/0118064 | A1 * | 5/2011 | Krysiak | A63B 41/02 473/603 |
| 2011/0136603 | A1 | 6/2011 | Lin et al. | |
| 2011/0224008 | A1 * | 9/2011 | Molinari | A63B 37/0003 473/200 |
| 2011/0304497 | A1 * | 12/2011 | Molyneux | A43B 1/0054 342/42 |
| 2013/0055814 | A1 * | 3/2013 | Mol | G01P 15/09 73/514.34 |
| 2013/0127299 | A1 * | 5/2013 | Kim | H01L 41/18 310/364 |
| 2014/0194232 | A1 * | 7/2014 | Krysiak | A63B 43/06 473/570 |
| 2014/0235379 | A1 * | 8/2014 | Nurnberg | A63B 43/004 473/570 |
| 2015/0182810 | A1 * | 7/2015 | Thurman | A63B 43/004 473/570 |
| 2015/0196811 | A1 * | 7/2015 | Laurienzo | A63B 43/06 473/570 |
| 2016/0155928 | A1 * | 6/2016 | Savelli | H01L 41/1132 310/318 |
| 2016/0233795 | A1 * | 8/2016 | Savelli | A43B 3/0015 |
| 2016/0236043 | A1 * | 8/2016 | Savelli | A63B 39/00 |
| 2017/0144031 | A1 * | 5/2017 | Krysiak | A63B 43/004 |
| 2017/0189768 | A1 * | 7/2017 | Dingle | A63B 43/004 |
| 2017/0232306 | A1 * | 8/2017 | Thurman | A63B 43/004 473/570 |
| 2017/0239530 | A1 * | 8/2017 | Savelli | A63B 43/004 |

FOREIGN PATENT DOCUMENTS

| | | |
|---|---|---|
| WO | 2005/044396 A2 | 5/2005 |
| WO | 2007/052206 A1 | 5/2007 |

* cited by examiner

DEVICE WITH DEFORMABLE SHELL INCLUDING AN INTERNAL PIEZOELECTRIC CIRCUIT

BACKGROUND OF THE INVENTION

1. Field of the Invention

The invention relates to the functionalization of balls, particularly deformable balls, especially in the field of sports and/or of physical restoration and/or leisure, such as, for example, tennis balls.

2. Description of Related Art

In ball sports and physical restoration based on such objects, it is useful to have statistics enabling players to analyze their play and enabling medical staff to assess the quality of the exercises practiced by the patients. Usually, such statistics are manually collected by, for example, counting the number of hits, bounces, or others that a player or a patient exerts on a ball for a determined time period.

It is also advantageous to integrate in balls electronic functions enabling to automatically make statistics and/or to convert into electric energy and store the mechanical energy provided to these objects during the use thereof.

Document US 2011/136603 discloses a sports ball comprising a deformable shell delimiting an inner space under pressure, such as for example a tennis ball, and comprising a piezoelectric element arranged on or inside of the deformable shell to convert the mechanical energy corresponding to the shell deformation into electric energy, and an electronic circuit comprising a battery for storing the electric energy thus generated and a processing circuit powered by the battery, such as for example an accelerometer, a pressure sensor, or a GPS.

This document however says nothing of the way of integrating these different components in the ball. Now, such an integration generally aims at a plurality of objects, which may be contradictory.

First, a high rate of conversion of mechanical energy into electric energy is desired, since the electric energy may be used to power electronic circuits requiring a high energy level in order to operate.

Then, the components integrated in the ball should provide a minimum hindrance to the aerodynamics and to the deformations thereof, since a functionalized ball having mechanical characteristics close and ideally identical to those of a conventional ball is desired in order to be used instead of the latter, particularly in sports, where balls must satisfy very strict criteria to be deemed conformal.

Finally, it is preferable for the components to be mechanically robust to face mechanical stress which may be high due to the shocks and significant accelerations undergone by the ball. The inventors have further observed, in the context of trials on different types of electronic circuit and of electronic connections integrated in a tennis ball, frequent breakages of these components.

SUMMARY OF THE INVENTION

The present invention aims at providing a device with a deformable shell delimiting an internal space which comprises circuits generating electricity under the effect of deformations of the shell and using the electricity generation for processing and/or storage purposes, which has a mechanical behavior close to that of a device comprising no such circuits, and having circuits which are robust while providing a high rate of conversion of mechanical energy into electric energy.

To achieve this, an object of the invention is a device comprising a deformable shell delimiting an inner space, the device comprising:

a resilient band suspended in the inner space and comprising two ends secured to the deformable shell, the band comprising a piezoelectric material to generate an electric voltage under the effect of the deformation of the shell and two electrodes for collecting the voltage; and an electronic circuit for processing the voltage, connected to the electrodes of the resilient band.

"Deformable" here means a shell capable of deforming under the effect of impacts to which it is submitted during a standard use of the shell.

In other words, the device according to the invention provides a specific tradeoff between the different previously-described objects.

First, the resilient band deforms whatever the location of an impact on the ball or the direction of the acceleration thereof, which enables to have a minimum rate of conversion of mechanical energy into electric energy.

Further, since a band is, by definition, an object having a limited width as compared with its length, the band has a limited contact area with the deformable shell, which enables to limit the effects of the band on the shell deformation properties.

Finally, the electronic circuit being directly arranged on the resilient band, it is thus not directly submitted to impacts through the shell and there is no need for very long electric connections, which are usually fragile, as might be the case for an electronic circuit arranged at a distance from the piezoelectric material. Further, if the resilient band is placed on a plane of symmetry of the shell, the modification of the device behavior caused by the electronic circuit is minimized.

According to an embodiment, the resilient band comprises a resilient support layer having two opposite surfaces, and a layer formed of piezoelectric material arranged on at least one of the surfaces. Thereby, the resilience function, which transfers the mechanical energy applied to the shell to the piezoelectric material, and the piezoelectric function are largely decoupled, which enables to optimize each of them.

According to an embodiment, the modulus of elasticity of the support layer is substantially identical to the modulus of elasticity of the deformable shell. High values of the modulus of elasticity, or "Young's modulus" and of the Shore hardness allow a significant deformation of the resilient band, and accordingly a significant deformation of the piezoelectric material and, as a corollary, a significant electric power generation. A lag between the deformation of the deformable shell and the deformation of the resilient band, all the greater as the moduli of elasticity are different from each other, has been observed. Such a lag may significantly impact the shell behavior, particularly when bounces occur. For example. By minimizing the difference between moduli of elasticity, the lag is thus minimized.

According to an embodiment, the D-scale Shore hardness of the support layer is greater than or equal to 70 and the thickness of the support layer is greater than or equal to 3 millimeters. As a variation, the D Shore hardness of the support layer is greater than or equal to 70 and the ratio of the length of the support layer to the thickness thereof is smaller than 2,200. In other words, such ranges of values enable to minimize the effect of the above-mentioned lag on the shell behavior while ensuring a large deformation of the resilient band, and thus, a high electric power generation.

More particularly, the support layer is made of polyurethane or of ethylene-propylenediene monomer (EDPM), such materials indeed having a Shore hardness capable of limiting the lag phenomenon.

According to an embodiment, the layer of piezoelectric material is formed of piezoelectric polymer, particularly of polyvinylidene fluoride ("PVDF") and is covered with a plastic layer. PVDF has the advantage of being both light, flexible, and mechanically resistant. It has further been observed that covering the piezoelectric layer with a plastic film enables to reinforce the mechanical robustness thereof, and thus to make it less sensitive to breakages capable of occurring due to violent shocks on the deformable shell.

According to an embodiment, the deformable shell and the resilient band each comprise a plane of symmetry, and the planes of symmetry of the deformable shell and of the resilient band coincide, which enables to decrease the effect of the position of an impact received by the deformable shell on the deformation of the resilient band, and thus on the electric power generation by the piezoelectric material.

According to an embodiment, the deformable shell is a sphere, and the resilient band is a cuboid having a width smaller than 50% of the sphere diameter. The ends of the resilient band are especially housed in the shell by gluing. Now, it can be observed that a significant volume of glue used to secure the band to the shell impacts the mechanical properties of the shell. It has also been observed that by selecting a width smaller than 50% of the shell diameter, this impact is substantially decreased while allowing a sufficient gluing.

According to an embodiment, the deformable shell is a sphere and the center of mass of the assembly formed of the resilient band and of the electronic circuit is arranged at the center of the sphere. The center of mass is thus the same as that of the shell, which minimizes the impact of the presence of the band and of the electronic circuit on the mechanical properties of the device.

According to an embodiment, the electronic circuit comprises an energy storage element. The stored energy thus enables to operate circuits requiring a significant electric power, such as for example radiofrequency transmission modules enabling to communicate with the outside of the shell.

More particularly, the storage element comprises a microbattery formed on a flexible or rigid substrate. This type of electric energy storage means is very light, usually with a low weight and surface area for a large storage capacity.

More particularly, the electronic circuit comprises a circuit for generating data from the electric voltage generated by the resilient band, and a circuit of wireless transmission of the data outside of the deformable shell, the generation and transmission circuits being powered by the electric energy storage element.

According to an embodiment, the electronic circuit comprises a circuit for determining the force exerted on the deformable shell according to the amplitude of the voltage generated by the resilient band. It has indeed been observed that there exists a bijective relation between the amplitude of the generated electric voltage and the amplitude of the force exerted on the deformable shell. It is thus possible to deduce the latter from the generated voltage, for example, by using a chart.

BRIEF DESCRIPTION OF THE DRAWINGS

The invention will be better understood on reading of the following description provided as an example only in relation with the accompanying drawings, where.

DETAILED DESCRIPTION OF THE INVENTION

Figure 1:
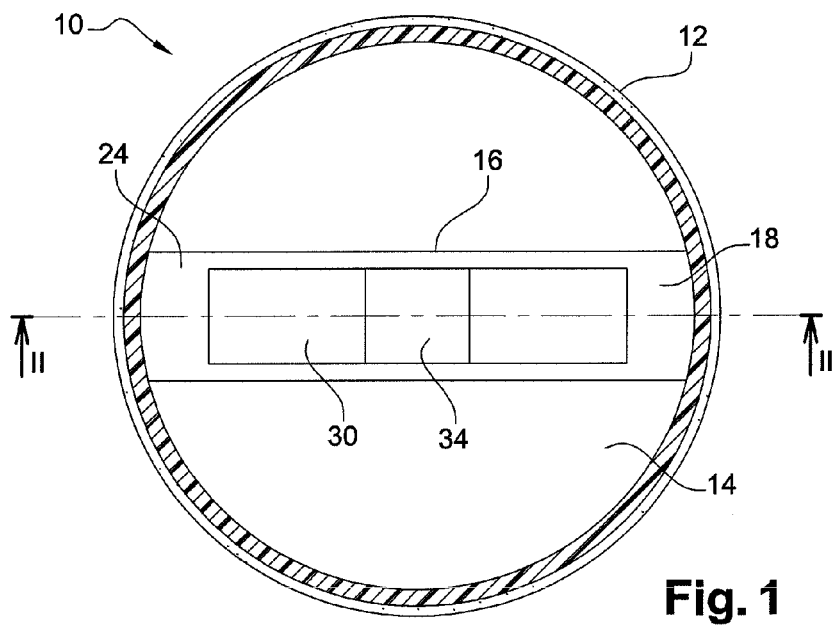
FIG. 1 is a simplified cross-section view of a tennis ball, exhibiting an upper surface of an energy recovery system according to the invention.
Figure 2:
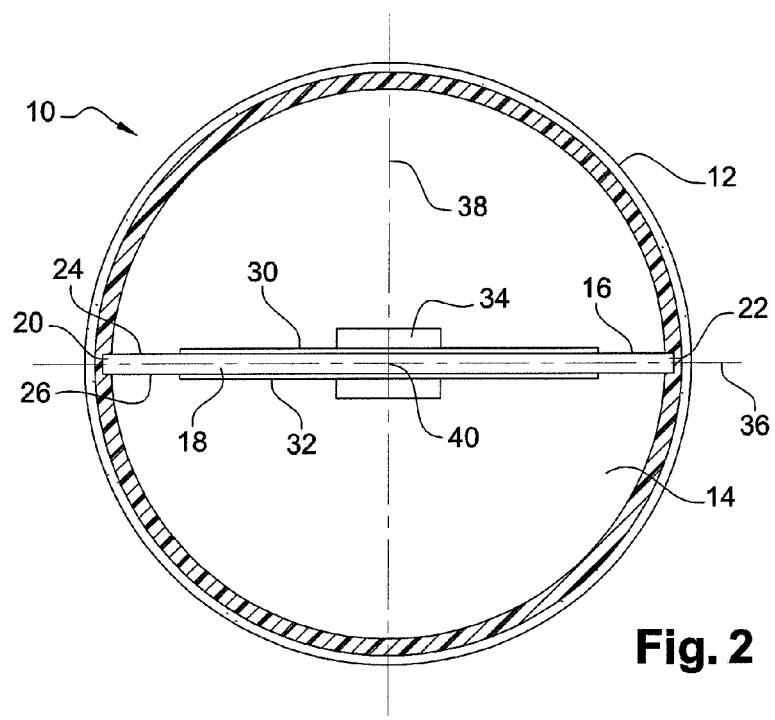
FIG. 2 is a simplified cross-section view along plane II-II of FIG. 1.

A tennis ball 10 according to the invention will now be described in relation with FIGS. 1 and 2. Tennis ball 10 comprises a deformable spherical shell 12 defining a hollow inner space 14. Shell 12 is for example formed of a rubber layer covered with an external felt layer and inner space 14 comprises air under a pressure greater than the atmospheric pressure, particularly a pressure in the order of 2 bars. Tennis ball 10 has a diameter between 6.5 cm and 6.9 cm, and a mass between 56 grams and 59 grams.

Tennis ball 10 comprises in space 14 an energy conversion and data processing system 16 comprising:

a support band 18, made of a resilient material, for example, polyurethane, EDPM, rubber, or neoprene. Band 18 for example has the shape of a cuboid, with its two ends 20, 22 secured to shell 12, for example by being housed and glued in respective notches of shell 12, and comprising two opposite surfaces 24, 26; a piezoelectric membrane 30 and 32 arranged on one or each of surfaces 24, 26 of band 18, secured to the surface, for example, by gluing, and comprising two electrodes (not shown) for collecting the voltage generated by the membrane under the effect of the deformation thereof; and an electronic circuit 34, arranged on one and/or the other of surfaces 24, 26 of band 18, and secured to the band, for example, by gluing, circuit 34 being electrically connected to the electrodes of piezoelectric membranes 30 and 32.

Figure 3:
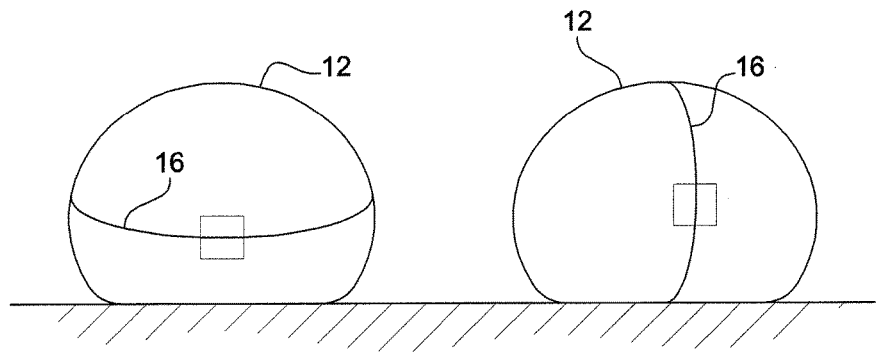
FIG. 3 is a simplified cross-section view illustrating the bending of a resilient band forming part of the energy recovery system of FIGS. 1 and 2 according to two positions of impact on the tennis ball.

In operation, as illustrated in FIG. 3, when tennis ball 10 is submitted to an impact or an acceleration, for example, a bounce on the ground, shell 12 deforms, which causes the deformation of resilient band 18, particularly the bending thereof. Piezoelectric membranes 30 and 32 are thus also deformed and thus generate an electric voltage across their respective electrodes.

Figure 4:
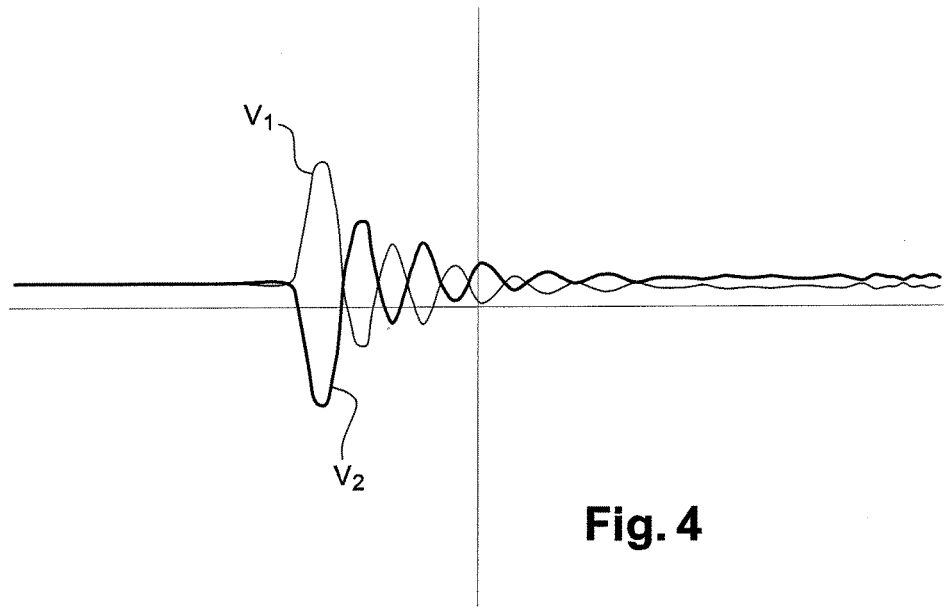
FIG. 4 is a drawing illustrating the voltages generated by two piezoelectric membranes arranged on either side of the resilient band when the tennis ball receives an impact.

FIG. 4 is a diagram of voltages V1 and V2 respectively generated by piezoelectric membranes 30 and 32 when tennis ball 10 has been hit, the voltages being of opposite signs due to the compressive stress of one of the membranes while the other membrane is being stretched. The amplitude of the first peak of the voltage is directly linked to the force exerted on ball 10, the next oscillations corresponding to the oscillation of band 18 until it returns to its idle position, the invention enabling to obtain voltages having an amplitude of several hundreds of volts, as will be described in further detail hereafter.

System 16 is advantageously optimized so that the ball according to the invention has a mechanical behavior, particularly in terms of deformation and aerodynamic properties, close to the behavior of a conventional tennis ball comprising no such system.

First, at rest, the center of mass of system 16 is confounded with center 40 of ball 10. System 16 further has at least one plane of symmetry 36, 38, confounded with a plane of symmetry of tennis ball 10 crossing center 40 thereof system 16 thus has a symmetrical weight distribution adapted to the spherical geometry of ball 10.

Figure 5:
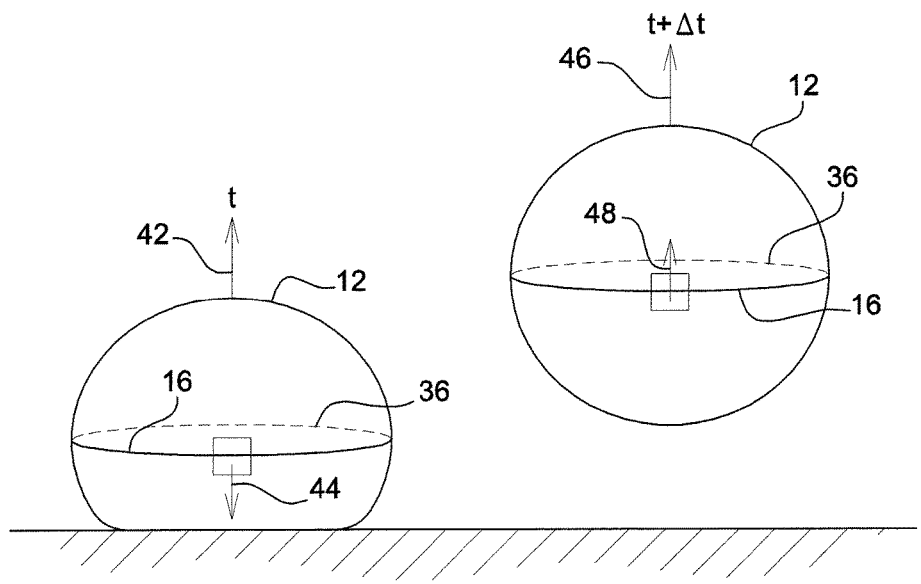
FIG. 5 is a simplified cross-section view of the tennis ball illustrating the lag between the motion of the tennis ball and the motion of the resilient band.

Advantageously, the modulus of elasticity of resilient band 18 is selected to minimize the lag between the deformation of shell 12 and the deformation of band 16. As illustrated in FIG. 5, when ball 10 starts taking off at time "t" from the surface that it has impacted, for example, the ground in the case of a bounce, as illustrated by arrow 42, resilient band 18 is submitted to another motion in an opposite direction, such as illustrated by arrow 44, the motion of band 18 and of ball 10 having the same direction after a duration Δt, as illustrated by arrows 46, 48. Such a lag may significantly impact the ball bounce. Selecting a modulus of elasticity and hardness of resilient band 18 close to the modulus of elasticity of shell 12 enables to substantially decrease this lag, and thus to obtain a behavior close to that of a conventional tennis ball.

The amplitude of the lag also depends on the total weight of system 16, whereby the modulus of elasticity of band 18 is determined according to this weight. More particularly, it has been observed that a band formed of a material having a D Shore hardness greater than 70 and a thickness greater than 3 mm enables to obtain a bounce close to that of a ball which does not comprise system 16. The same effect has been observed for a D Shore hardness of support layer 18 greater than or equal to 70 and a ratio of the length of support layer 18 to the thickness thereof smaller than 2,200. For example, a band 18 made of polyurethane, having a Shore hardness equal to 80, or made of EDPM, having a Shore hardness equal to 70, a 15-mm width, and a 4-mm thickness enables to obtain a bounce greater than or equal to 80% of the bounce of a ball.

Preferably, the width of band 18 is smaller than 50% of the diameter of shell 12 to minimize the band volume in the shell and the glue volume used to secure band 18 in shell 12, and to accordingly decrease the impact of the presence of the band on the deformation properties of shell 12.

Figure 6:
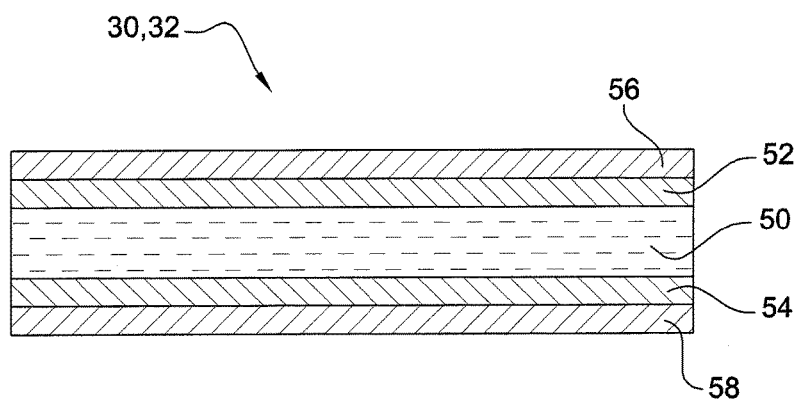
FIG. 6 is a simplified cross-section view of a piezoelectric membrane forming part of the energy recovery system.

Referring to FIG. 6, piezoelectric membranes 30, 32 each comprise:
- a piezoelectric film 50, having a thickness advantageously in the range from 10 micrometers to 200 micrometers, formed in one piece or in a plurality of pieces;
- two metal layers 52, 54, having a thickness in the range from a few nanometers to a few tens of micrometers each, deposited on either side of piezoelectric film 50, for example, made of silver, of copper nitride, of aluminum, and forming two electrodes for collecting the electric charges generated by film 50;
- optionally, two flexible reinforcement layers 56, 58, for example, made of plastic, such as polyethylene terephthalate ("PET") or polyethylene naphthalate ("PEN"), respectively deposited on electrodes 52, 54.

Advantageously, piezoelectric film 50 is made of polyvinylidene fluoride ("PVDF"), which has the advantage of being at the same time light, flexible, and mechanically resistant. As a variation, film 50 is made of lead titanium zirconate ("PZT"), of zinc oxide ("ZnO"), or of a composite material made of at least two materials among these and PVDF. For example, the piezoelectric membranes are "DT sensors" manufactured by Measurement Specialties, Inc.

Electronic circuit 34 implements functions of analysis and processing of the voltages delivered by piezoelectric membranes 30, 32 and comprises an electric energy storage element and a data generation circuit. Circuit 34 is particularly designed to disturb as little as possible the aerodynamic behavior of ball 10.

First, electronic circuit 34 is selected to be as light as possible given the functions that it implements. Particularly, the electric energy storage element is advantageously formed of a microbattery formed on a flexible or rigid substrate. For example, the storage element is a rigid substrate microbattery from the "EnerChip" range of Cymbet® Corp., for example, a microbattery having reference "CBC050-M8C" with a 8×8 mm$^2$ surface area for a 50 μAh capacity, or a Solicore®, Inc. flexible substrate microbattery, for example, a microbattery having reference "SF-2529-10EC" with a foldable surface of 25.75×29 mm$^2$ for a 10-mAh capacity. As a variation, the electric energy storage element comprises one or a plurality of capacitors and/or one or a plurality of supercapacitors.

The data generation circuit is for example a printed circuit comprising an electronic chip equipped with a microcontroller enabling to process data and a radio transmission module, for example, transmitting according to the ZigBee protocol. The data generation circuit is electrically powered by the electric energy storage element and/or an integrated battery, of "button" cell type.

For example, the data generation circuit processes the electric pulses generated by piezoelectric membranes 30, 32 and generates data relative to the pulses. Thus, electronic circuit 34 may comprise:
- a circuit for counting the number of pulses generated since the putting into service of the tennis ball,
- a circuit for determining the average or individual intensity of the pulses,
- and/or a circuit for determining the average or individual duration of the pulses,
- a radio frequency emitter enabling to locate the ball on a tennis court, which for example enables to know whether a ball is in or out,
- an accelerometer enabling to determine the ball speed.

The data thus generated are for example stored in an internal memory of circuit 34 and/or transmitted by wireless communication outside of the ball in order to be collected.

Particularly, knowing the number of pulses enables to know, in addition to the number of impacts received by the ball, the state of wear thereof, since this state of wear directly depends, in particular, on this number. The number of impacts, the intensity and the duration thereof further form statistic data useful for a player who can thus know the strength of his/her shots and the type of shots that he/she applies to the ball, etc. It has in particular been observed that there exists a bijective relation between the amplitude of the first pulse following an impact on the ball and the force of this impact. The data generation circuit for example comprises a chart storing force values according to the voltage amplitude and calculates the force exerted on the ball according to the amplitudes of stored voltages.

Advantageously, circuit 34 is distributed in two portions, arranged on either side of resilient band 18 to distribute its weight and obtain for the center of mass of system 16 to be arranged at the center of the ball and on a plane of symmetry of system 16, which enables to decrease the dependence of the electric power generation to the position of an impact on shell 12 or to the direction of an acceleration undergone by ball 10. For example, the electric energy storage elements are arranged on one side of resilient band 18, and the data generation circuit is arranged on the other side of band 18.

A tennis ball has been described. Of course, the invention applies to any type of balls, and generally to any object having a deformable shell.

Applications to sport have been described. Of course, the invention applies to other types of activity, particularly physical restoration activities which use balls or the like, the statistics generated by such objects according to the invention enabling the medical staff to study, for example, the quality of the exercises performed by the patients.

The invention claimed is:

1. A passive device having a deformable shell delimiting an inner space, the device comprising:
   a resilient band suspended in the inner space and having two ends that are secured to the deformable shell, the resilient band comprising a piezoelectric material that generates an electric voltage under the effect of a deformation of the shell, and two electrodes for collecting the electric voltage; and
   an electronic circuit that processes the electric voltage and which is arranged on the resilient band and connected to the electrodes of the resilient band, wherein the device is passive in that the electric voltage supplied to the electronic circuit is generated only by the piezoelectric material;
   wherein the resilient band comprises a resilient support layer having two opposite surfaces, and a layer of the piezoelectric material arranged on at least one of the surfaces; and
   wherein a Shore hardness the support layer is greater than of equal to 70, and a ratio of a length of the support layer to a thickness thereof is smaller than 2,200.

2. The passive device of claim 1, wherein a modulus of elasticity of the support layer is substantially identical to a modulus of elasticity of the deformable shell.

3. The passive device of claim 1, wherein the support layer is made of one of polyurethane and of ethylene-propylene-diene monomer.

4. The passive device of claim 1, wherein the layer of piezoelectric material is made of a piezoelectric polymer, and is covered with a plastic layer.

5. The passive device of claim 1, wherein the deformable shell and the resilient band each comprise a plane of symmetry, and wherein the respective planes of symmetry of the deformable shell and the resilient band coincide with one another.

6. The passive device of claim 1, wherein the deformable shell is a sphere, and wherein the resilient band is a cuboid having a width that is smaller than 50% of a diameter of the sphere.

7. The passive device of claim 1, wherein the deformable shell is a sphere, and wherein a center of mass of an assembly formed of the resilient band and the electronic circuit is arranged at a center of the sphere.

8. The passive device of claim 1, wherein the electronic circuit comprises an electric energy storage element.

9. The passive device of claim 8, wherein the electric energy storage element comprises a microbattery formed on a flexible substrate or a rigid substrate.

10. The passive device of claim 8, wherein the electronic circuit comprises a circuit for generating data from the electric voltage generated by the resilient band, and a wireless transmission circuit for the data outside the deformable shell, the generation and transmission circuits being powered by the electric energy storage element.

11. The passive device of claim 1, wherein the electronic circuit comprises a circuit for determining the force exerted on the deformable shell according to an amplitude of the electric voltage generated by the resilient band.

12. The passive device of claim 1, wherein the deformable shell is a tennis ball.

13. The passive device of claim 4, wherein the layer of piezoelectric material is polyvinylidene fluoride.

* * * * *